United States Patent [19]

Sugino

[11] Patent Number: 5,178,721
[45] Date of Patent: Jan. 12, 1993

[54] PROCESS AND APPARATUS FOR DRY CLEANING BY PHOTO-EXCITED RADICALS

[75] Inventor: Rinshi Sugino, Odawara, Japan

[73] Assignee: Fujitsu Limited, Tokyo, Japan

[21] Appl. No.: 742,240

[22] Filed: Aug. 8, 1991

[30] Foreign Application Priority Data

Aug. 9, 1990 [JP] Japan ................... 2-213324

[51] Int. Cl.⁵ ............... H01L 21/306; B44C 1/22; C03C 15/00; C23F 1/00
[52] U.S. Cl. ................... 156/626; 134/1; 156/643; 156/646; 156/656; 156/657; 156/662; 156/345
[58] Field of Search .......... 156/626, 627, 643, 646, 156/657, 662, 345, 656; 134/1, 31, 102; 427/53.1; 118/712, 729, 50.1, 620, 623

[56] References Cited

U.S. PATENT DOCUMENTS

| | | | |
|---|---|---|---|
| 2,841,477 | 7/1958 | Hall | 156/643 |
| 4,885,047 | 12/1989 | Ury et al. | 156/646 X |
| 4,987,008 | 1/1991 | Yamazaki et al. | 156/646 X |

FOREIGN PATENT DOCUMENTS 62-42530 2/1987 Japan.
1-217926 8/1989 Japan.

Primary Examiner—William A. Powell
Attorney, Agent, or Firm—Nikaido, Marmelstein, Murray & Oram

[57] ABSTRACT

In a photo-excited dry cleaning with a halogen, a highly efficient radical generation can be obtained while selecting a cleaning gas or reaction gas pressure appropriate for removing contaminants from a substrate to be cleaned. This can be attained by controlling a light transmission distance or a distance from a window of a cleaning chamber through which a light enters the cleaning chamber to the substrate.

19 Claims, 4 Drawing Sheets

CLEANING GAS PRESSURE (Torr)

5,178,721

PROCESS AND APPARATUS FOR DRY CLEANING BY PHOTO-EXCITED RADICALS

BACKGROUND OF THE INVENTION

1. Field of the Invention

The present invention relates to a process and apparatus for dry cleaning a substrate by using photo-excited radicals.

2. Description of the Related Art

Recently, semiconductor devices such as LSIs have become highly integrated and the structures of the semiconductor devices complicated, and thus the methods of cleaning a semiconductor wafer must be remarkably improved.

Semiconductor wafers, etc. are wet cleaned by immersing the semiconductor wafers, etc. in a cleaning solution, a high purity acid or alkali solution or an ionized water, but such a wet cleaning does not provide a complete removal of contaminant metals such as iron (Fe) and sodium (Na) from the surface of a semiconductor wafer, etc. (a substrate to be cleaned) and it is impossible in a wet cleaning to avoid a recontamination of the substrate by a readherence of contaminants from the solution.

Accordingly, a dry etching process using a vaporization of contaminant materials by a gas is used as a cleaning process which provides an effective cleaning of even a complex device structure, and a complete removal of contaminants from the surface of a substrate. The present inventors proposed, as typical of such processes, a removal of contaminants by etching a thin surface layer of a silicon wafer with chlorine radicals (*Cl) formed by irradiation of a light to chlorine gas (Japanese Unexamined Patent Publication (Kokai) No. 62-42530). Also, the inventors proposed a process of bringing a thermally oxidized silicon layer into contact with chlorine radicals, to capture and remove contamination materials from the oxide layer without etching (Japanese Unexamined Patent Publication (Kokai) No. 1-217926).

These processes are characterized by a treatment by photo-excited chlorine radicals. FIG. 1 schematically illustrates a conventional apparatus for a dry cleaning, in which reference numeral 1 denotes a cleaning chamber made of quartz glass, 2 is a wafer or a substrate to be cleaned, 3 is a stage for the substrate, 4 is a transparent window made of a transparent quartz, 5 is light source (an ultra-violet source such as a high pressure mercury lamp), 6 is reflection mirror, 7 is a chlorine gas supply source, 8 is a flow meter, and 9 is an evacuation port.

In such an apparatus, a wafer 2 is heated to 200°–400° C. by a heater installed in the substrate stage 3, and a high purity (99.999%) chlorine gas is supplied to the reaction chamber 1 from the chlorine gas supply source 7 through the flow meter 8. The wafer 2 in the reaction chamber 1 is irradiated with an ultra-violet ray (wave length: about 200–300 nm) emitted from the light source 5 and reflected by the mirror 6. By making an energy of the ultra-violet ray about 20 mW/cm$^2$, the chlorine gas in the reaction chamber 1 is activated to form radicals, and these radicals etch the wafer 2 so that contaminants are removed therefrom. The term "radicals" means neutral atoms of a reaction gas an outermost orbit of which is filled with electrons, and therefore, which are in the state having a very high reaction energy.

Nevertheless, the conditions for obtaining a maximum rate of a generation of radicals are not known, and therefore, an object of the present invention is to provide a photo-excited dry cleaning process and apparatus which enables an utilization of a high rate generation of radicals, to thereby improve the cleaning efficiency.

Also, the inventors found that, in a photo-excited dry cleaning process, an appropriate pressure of a reaction gas in a reaction chamber exists, and outside of this appropriate pressure, certain contaminants are not effectively removed and the surface of a substrate cleaned by the process is not flat or smooth, and that the appropriate pressure depends on the type of the substrate, contaminants, and reaction gas, etc. Therefore, another object of the present invention is to provide a photo-excited dry cleaning process at an appropriate reaction gas pressure which will effectively remove contaminants and obtain a flat and smooth cleaned surface, with a high radical generation or etching efficiency.

SUMMARY OF THE INVENTION

The above objects of the present invention are attained by a method of a photo-excited dry cleaning of a substrate by placing the substrate in a cleaning chamber having a window transparent to a light, feeding a halogen-containing gas in the cleaning chamber, and irradiating the halogen-containing gas in the cleaning chamber with a light, the light passing through the window of the cleaning chamber toward the substrate, to generate halogen radicals and thereby clean the substrate, said method comprising the steps of a) determining relationships of an etching rate of a substrate with a distance from a window of a cleaning chamber to the substrate and with a pressure of a halogen-containing gas in the cleaning chamber, b) placing a substrate in the cleaning chamber such that the distance from the window of the cleaning chamber to the substrate is a first distance, c) feeding the halogen-containing gas in the cleaning chamber and adjusting a pressure of the halogen-containing gas such that an etching rate of the substrate is not less than 90% of a maximum etching rate at said first distance, and then d) irradiating the substrate with a light through the window to remove a portion of the substrate.

Alternatively, the above objects of the present invention are attained by a method for dry cleaning a substrate by placing the substrate in a cleaning chamber having a window transparent to a light, feeding a halogen-containing gas in the cleaning chamber and irradiating the halogen-containing gas in the cleaning chamber with a light, the light passing through the window of the cleaning chamber toward the substrate, to generate halogen radicals and thereby clean the substrate, said method comprising the steps of a) determining relationships of an etching rate of a substrate with a distance from a window of a cleaning chamber to the substrate and with a pressure of a halogen-containing gas in the cleaning chamber, b) placing the substrate in the cleaning chamber, c) feeding the halogen-containing gas in the cleaning chamber such that a pressure of the halogen-containing gas in the cleaning chamber is a first pressure, d) adjusting a distance from the window of the cleaning chamber to the substrate such that an etching rate of the substrate is not less than 90% of a maximum etching rate at said first pressure, and e) irradiating the substrate with a light to remove a portion of the substrate.

Although in the above methods, an etching rate is determined and used as a measure of a radical generation rate, a rate of removing a contaminant such as C, Fe or Al from a surface of a substrate may be determined and used to attain a high efficiency of cleaning.

Moreover, the substrate may be heated while cleaning.

Further, in an embodiment of the present invention, when a substrate is to be cleaned twice after different processes, the distance from the window of the cleaning chamber to the substrate is first selected to be a first distance in a first cleaning process and is then selected to be a second distance in a second cleaning process, while the cleaning gas pressure is adjusted appropriately in each of the first and second cleaning process in accordance with the above criteria. Similarly, the cleaning gas pressure may be selected to be a first pressure in a first cleaning process and a second pressure in a second cleaning process, while the distance from the window to the substrate is adjusted in accordance with the above criteria.

Also, in the present invention, there is provided an apparatus for dry cleaning a substrate, comprising a cleaning chamber, means for mounting a substrate to be cleaned in said cleaning chamber, a window provided to said cleaning chamber, which window is transparent to a light, means for feeding a halogen gas to said cleaning chamber, means for evacuating said cleaning chamber, a light source for irradiating a substrate placed in said cleaning chamber through said window, means for controlling a gas pressure in said cleaning chamber, and means for moving said mounting means for controlling a distance from said window to the substrate.

BRIEF DESCRIPTION OF THE INVENTION

DESCRIPTION OF THE PREFERRED EMBODIMENTS

Figure 2:
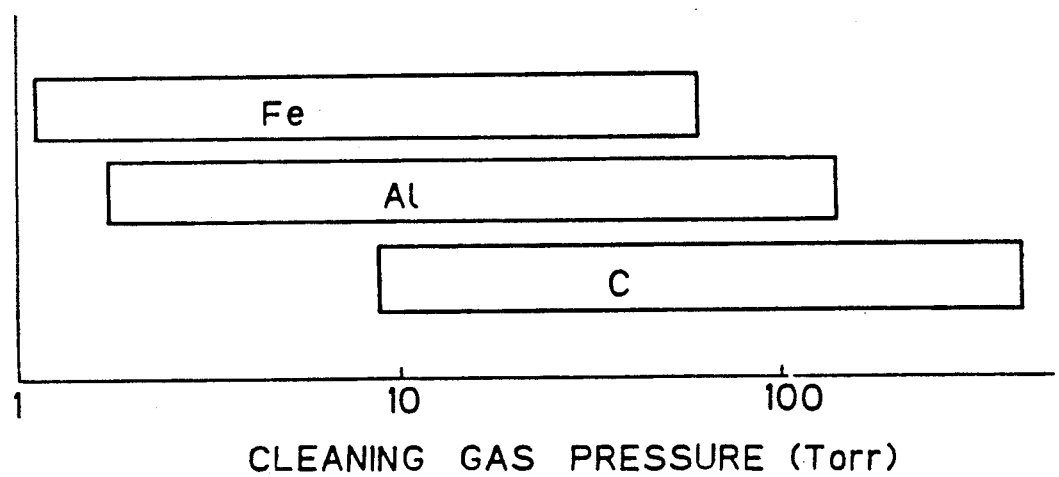
FIG. 2 shows appropriate cleaning gas pressures for some contaminants.

FIG. 2 shows effective reaction or cleaning gas (chlorine) pressures for removing contaminants such as Fe, Al and C, from a surface of a silicon wafer. As seen in FIG. 2, the lighter the atom weight of the contaminant elements the higher the pressure of the reaction gas appropriate or necessary for removing the contaminant elements, although at too low a pressure the amount of a cleaning gas is insufficient and the cleaning efficiency lowered. The reason why a lower gas pressure is appropriate or necessary for removing a heavy contaminant element is that a vapor pressure of a halide of a heavy element is usually lower than that of a halide of a light element.

For example, a surface of a mirror polished wafer is contaminant mainly by C (carbon). After a plasma treatment such as a dry etching, a wafer is contaminated by Fe (iron). After ion implantation, a wafer is contaminated by Al (aluminum). Therefore, preferably a cleaning gas pressure for dry cleaning a wafer is selected depending on the former process to which the wafer was subjected.

Figure 1:
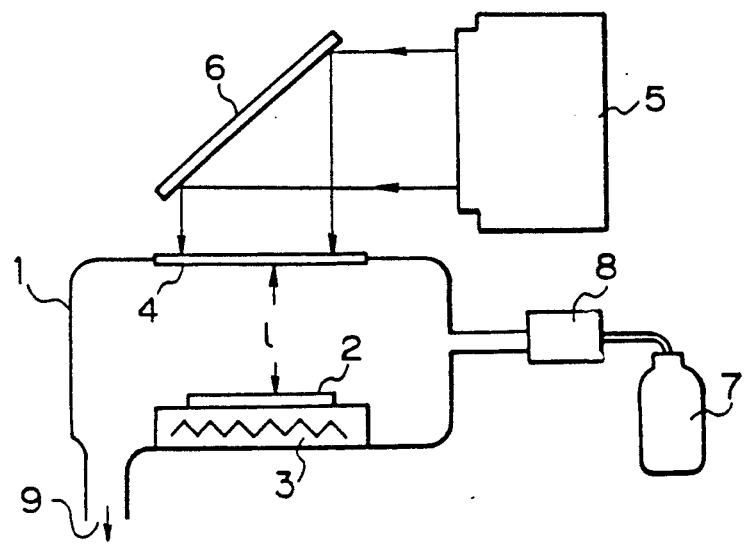
FIG. 1 is a schematic view of a conventional photo-excited dry cleaning apparatus.
Figure 3:
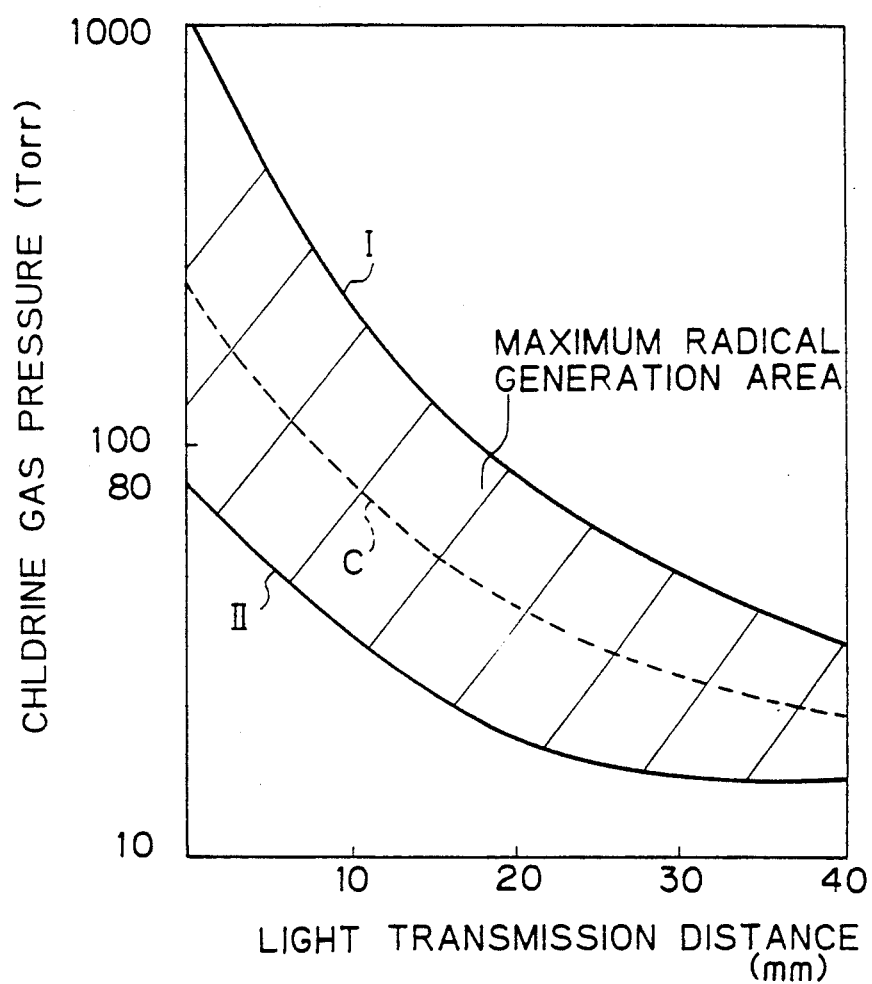
FIG. 3 shows the radical generation rate or etching rate in relation to the chlorine gas pressure and the light transmission distance.

FIG. 3 shows conditions for obtaining a maximum etching rate or radical generation, in which the ordinate represents a chlorine gas pressure, the abscissa represents a distance of a light transmission, the line C is a line at which a maximum etching rate is obtained at a fixed light transmission distance, and the lines I and II are upper and lower limits for obtaining an etching rate of 90% of the maximum rate. Therefore, in the hatched area, an etching rate of more than 90% of the maximum rate is obtained. The chlorine gas pressure is that (vacuum degree) in a cleaning chamber and the light transmission distance is a distance from the window to the substrate (see FIG. 1 or 5). The etching rate is determined by an etching amount of a wafer per unit time while the chlorine gas pressure and the light transmission distance are varied. Note, that the etching rate is considered to have a linear relationship to the chlorine radicals generation rate. Also, a rate of removing a contaminant material is in a linear relationship with a chlorine radicals generation rate.

The conditions for obtaining the above data include: a temperature of the wafer of 300° C., a wave length of an ultra-violet ray of 200-300 nm, and an irradiation energy in a cleaning chamber under vacuum of 20 mW/cm².

As seen in FIG. 3, a chlorine gas pressure for obtaining the maximum etching rate or an rate of more than 90% of the maximum rate is varied, and depends on the light transmission distance. Even if the chlorine gas is increased, the etching rate or the radical generation rate is not always increased, and a peak of the etching rate or the radical generation rate is followed by a decrease of the rate. This is considered to be because the chlorine gas hinders a transmission of a light.

Figure 4:
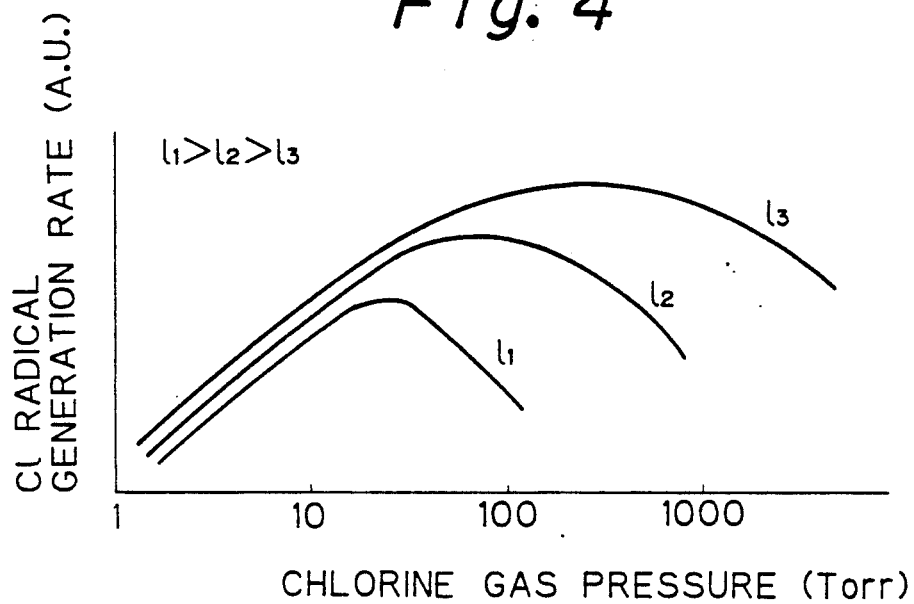
FIG. 4 shows the radical generation rate or etching rate in relation to the chlorine gas pressure at certain light transmission distances.

FIG. 3 is a result of data shown in FIG. 4. FIG. 4 shows relationships of the chlorine gas pressure and the light transmission distance in relation to the chlorine radicals generation rate, in which the light transmission distances $l_1$, $l_2$ and $l_3$ are fixed and the relationships between the chlorine radicals generation rate and the chlorine gas pressure are shown.

In FIG. 4, the light transmission distances have a relationship of $l_1 > l_2 > l_3$. In a fixed light transmission distance, a peak of the gas pressure appears, and this peak appears at a lower gas pressure when the light transmission distance is shorter. From the curved lines as shown in FIG. 4, a gas pressure at the peaks and gas pressures at upper and lower limits of 90% of the peaks, for each light transmission distance, and determined and plotted in FIG. 3. The area enclosed by the lines of the upper and lower limits is that area wherein the photo-etched dry etching of the present invention is performed.

The lines I and II in FIG. 3 are expressed by the following formulae:

$$\log I \leq (3 - \log 30)/3025 \times (X-55)^2 + \log 30$$

$$\log II \geq 1/1600 \times \log(16/3)(X-40)^2 + \log 15$$

Figure 5:
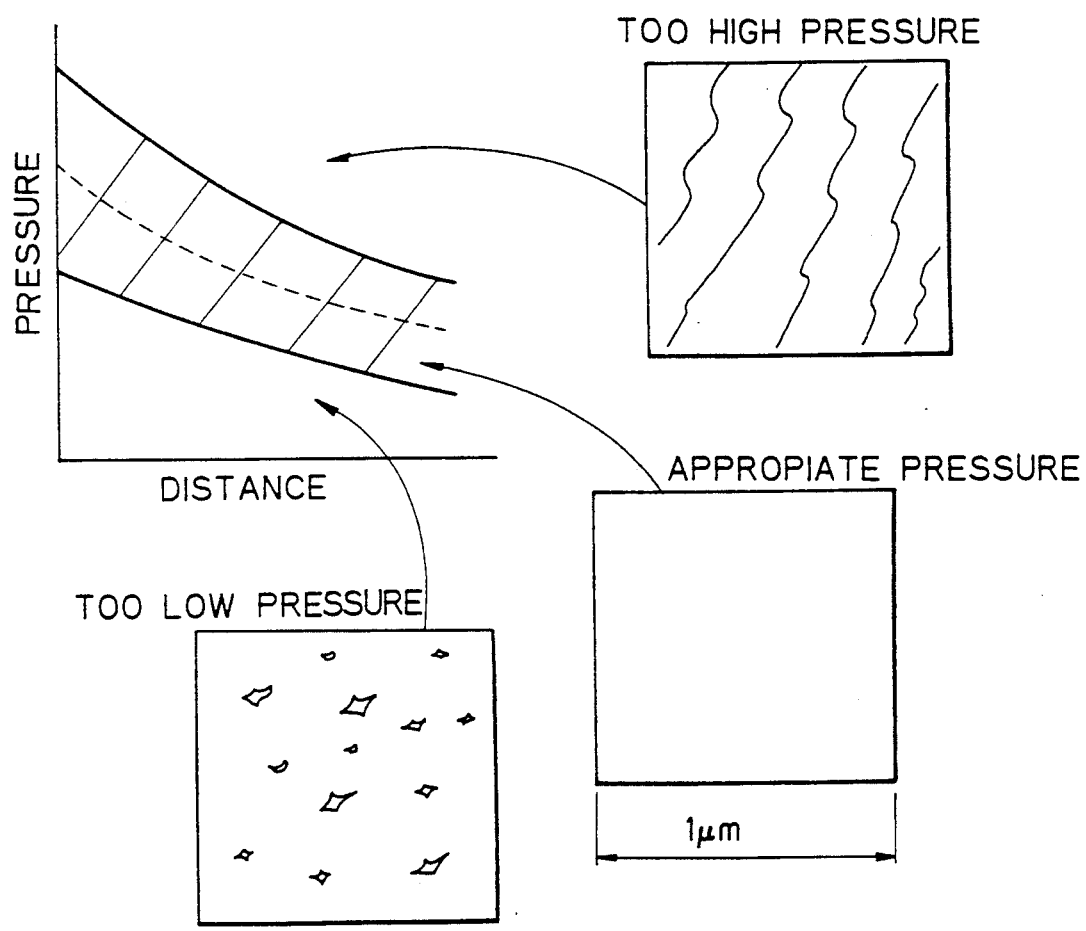
FIG. 5 shows surface states of a wafer cleaned at different cleaning gas pressures.

FIG. 5 illustrates surface states of a silicon wafer cleaned by a photo-excited dry cleaning under various chlorine pressures. FIG. 5 also shows schematic figures taken by an interference microphotograph. As shown in FIG. 5, if the chlorine gas pressure is appropriate, the surface of the cleaned wafer is flat and smooth; if the chlorine gas pressure is too high, steaks appears on the surface of the cleaned wafer; and if the chlorine gas pressure is too low, particles remain on the surface of the cleaned wafer.

Figure 6:
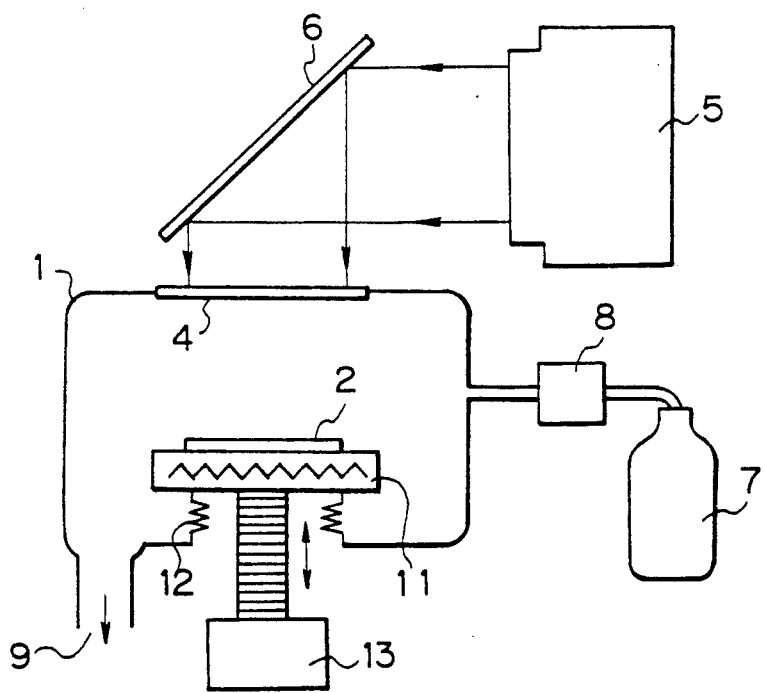
FIG. 6 is a schematic view of a photo-excited dry cleaning apparatus according to the present invention.

As described above, after an appropriate pressure of a cleaning or reaction gas is selected, to thus effectively remove certain contaminants from a wafer or substrate to obtain an efficient etching or radical generation rate, the distance of light transmission must be selected, i.e., varied. Accordingly, a photo-excited dry cleaning apparatus in which the light transmission distance can be varied is necessary. FIG. 6 shows an example of such an apparatus according to the present invention. In FIG. 6, the same reference numerals as those in FIG. 2 denote the same parts as those in FIG. 2, and the reference numeral 11 denotes a movable substrate stage, 12 a bellows, and 13 means for driving the movable substrate stage 11 up and down. The bellows 12 is provided to maintain a vacuum in the cleaning chamber 1 even if the movable substrate stage 11 is moved.

Thus, in accordance with an apparatus as shown in FIG. 6, while an appropriate pressure of a cleaning or reaction gas is first selected, a photo-excited dry cleaning can be performed at a high efficiency of radical generation of more than 90% of the maximum radical generation rate attainable at the gas pressure by controlling the light transmission distance or by controlling the position of the substrate.

Although chlorine is used in the above, it is clear that other halogens also may be similarly used in a photo-excited dry cleaning of the present invention. For example, fluorine is useful for removing silicon oxide.

I claim:

1. A method for dry cleaning a substrate by placing the substrate in a cleaning chamber having a window transparent to a light, feeding a halogen-containing gas in the cleaning chamber, and irradiating the halogen-containing gas in the cleaning chamber with a light, the light passing through the window of the cleaning chamber toward the substrate, to generate halogen radicals and thereby clean the substrate, said method comprising the steps of
   a) determining relationships of an etching rate of a substrate with a distance from a window of a cleaning chamber to the substrate and with a pressure of a halogen-containing gas in the cleaning chamber,
   b) placing a substrate in the cleaning chamber such that the distance from the window of the cleaning chamber to the substrate is a first distance,
   c) feeding the halogen-containing gas in the cleaning chamber and adjusting a pressure of the halogen-containing gas such that an etching rate of the substrate is not less than 90% of a maximum etching rate at said first distance, and then
   d) irradiating the substrate with a light through the window to remove a portion of the substrate.

2. A method according to claim 1, wherein said adjusted pressure of the halogen-containing gas is from 1 Torr to an atmospheric pressure.

3. A method according to claim 1, wherein said halogen is one of chlorine or fluorine.

4. A method according to claim 1, further comprising the step of heating the substrate.

5. A method for dry cleaning a substrate by placing the substrate in a cleaning chamber having a window transparent to a light, feeding a halogen-containing gas in the cleaning chamber, and irradiating the halogen-containing gas in the cleaning chamber with a light the light passing through the window of the cleaning chamber toward the substrate, to generate halogen radicals and thereby clean the substrate, said method comprising the steps of
   a) determining relationships of an etching rate of a substrate with a distance from a window of a cleaning chamber to the substrate and with a pressure of a halogen-containing gas in the cleaning chamber,
   b) placing the substrate in the cleaning chamber,
   c) feeding the halogen-containing gas in the cleaning chamber such that a pressure of the halogen-containing gas in the cleaning chamber is a first pressure,
   d) adjusting a distance from the window of the cleaning chamber to the substrate such that an etching rate of the substrate is not less than 90% of a maximum etching rate at said first pressure, and
   e) irradiating the substrate with a light to remove a portion of the substrate.

6. A method according to claim 5, wherein said pressure is from 1 Torr to an atmospheric pressure.

7. A method according to claim 5, wherein said halogen is one of chlorine and fluorine.

8. A method according to claim 5, further comprising the step of heating the substrate.

9. A method for dry cleaning a substrate by placing the substrate in a cleaning chamber having a window transparent to a light, feeding a halogen-containing gas in the cleaning chamber, and irradiating the halogen-containing gas in the cleaning chamber with a light, the light passing through the window of the cleaning chamber toward the substrate, to generate halogen radicals and thereby clean the substrate, said method comprising the steps of
   a) determining relationships of a rate of removing a contaminant from a substrate with a distance from a window of a cleaning chamber to the substrate and with a pressure of a halogen-containing gas in the cleaning chamber,
   b) placing a substrate having the contaminant adhered on a surface thereof in the cleaning chamber such that the distance from the window of the cleaning chamber to the substrate is a first distance,
   c) feeding the halogen-containing gas in the cleaning chamber and adjusting a pressure of the halogen-containing gas such that a rate of removing the contaminant from the substrate is not less than 90% of a maximum removing rate at said first distance, and then
   d) irradiating the substrate with a light through the window to remove the contaminant from the substrate.

10. A method according to claim 9, wherein said adjusted pressure of the halogen-containing gas is from 1 Torr to an atmospheric pressure.

11. A method according to claim 9, wherein said halogen is one of chlorine or fluorine.

12. A method according to claim 9, wherein said contaminant is at least one selected from the group consisting of Si, Fe, Al and C.

13. A method according to claim 9, further comprising the step of heating the substrate.

14. A method for day cleaning a substrate by placing the substrate in a cleaning chamber having a window transparent to a light, feeding a halogen-containing gas in the cleaning chamber, and irradiating the halogen-containing gas in the cleaning chamber with a light, the light passing through the window of the cleaning chamber toward the substrate, to generate halogen radicals and thereby clean the substrate, said method comprising the steps of
- a) determining relationships of a rate of removing a contaminant from a substrate with a distance from a window of a cleaning chamber to the substrate and with a pressure of a halogen-containing gas in the cleaning chamber,
- b) placing a substrate having the contaminant adhered on a surface thereof in the cleaning chamber,
- c) feeding the halogen-containing gas in the cleaning chamber such that a pressure of the halogen-containing gas in the cleaning chamber is a first pressure,
- d) adjusting a distance from the window of the cleaning chamber to the substrate such that a rate of removing the contaminant from the substrate is not less than 90% of a maximum removing rate at said first pressure, and
- e) irradiating the substrate with a light to remove the contaminant from the substrate.

15. A method according to claim 14, wherein said pressure is from 1 Torr to an atmospheric pressure.

16. A method according to claim 14, wherein said halogen is one of chlorine and fluorine.

17. A method according to claim 14, wherein said contaminant is at least one selected from the group consisting of Si, Fe, Al and C.

18. A method according to claim 14, further comprising the step of heating the substrate.

19. An apparatus for dry cleaning a substrate, comprising:
- a cleaning chamber;
- means for mounting a substrate to be cleaned in said cleaning chamber;
- a window provided in said cleaning chamber, which window is transparent to a light;
- means for feeding a halogen gas to said cleaning chamber;
- means for evacuating said cleaning chamber;
- a light source for irradiating a substrate placed in said cleaning chamber, through said window;
- means for controlling a gas pressure in said cleaning chamber; and
- means for moving said mounting means for controlling a distance from said window to the substrate.

* * * * *